(12) United States Patent
Huang

(10) Patent No.: US 11,088,171 B2
(45) Date of Patent: Aug. 10, 2021

(54) ARRAY SUBSTRATE, DISPLAY PANEL AND METHOD OF MANUFACTURING THE SAME

(71) Applicant: HKC Corporation Limited, Guangdong (CN)

(72) Inventor: Beizhou Huang, Guangdong (CN)

(73) Assignee: HKC Corporation Limited, Shenzhen (CN)

(*) Notice: Subject to any disclaimer, the term of this patent is extended or adjusted under 35 U.S.C. 154(b) by 70 days.

(21) Appl. No.: 16/258,684

(22) Filed: Jan. 28, 2019

(65) Prior Publication Data

US 2020/0020722 A1    Jan. 16, 2020

Related U.S. Application Data

(63) Continuation of application No. PCT/CN2018/124221, filed on Dec. 27, 2018.

(30) Foreign Application Priority Data

Jul. 16, 2018 (CN) .......................... 201810779922.5

(51) Int. Cl.
*H01L 27/12* (2006.01)
*G02F 1/1339* (2006.01)
*G02F 1/1362* (2006.01)
*G02F 1/1335* (2006.01)

(52) U.S. Cl.
CPC ........ *H01L 27/1218* (2013.01); *G02F 1/1339* (2013.01); *G02F 1/13394* (2013.01); *G02F 1/133514* (2013.01); *G02F 1/133516* (2013.01); *G02F 1/136209* (2013.01); *H01L 27/124* (2013.01); *H01L 27/1248* (2013.01);
(Continued)

(58) Field of Classification Search
CPC ............... H01L 27/1353; H01L 27/124; H01L 27/1218; H01L 27/1248; G02F 1/133514; G02F 1/133516; G02F 1/1339
See application file for complete search history.

(56) References Cited

U.S. PATENT DOCUMENTS

2009/0218568 A1* 9/2009 Dairiki ................ H01L 29/4908
257/57
2015/0084927 A1* 3/2015 Wyrwas ................ G06F 3/0412
345/175

(Continued)

FOREIGN PATENT DOCUMENTS

CN    102135688 A    7/2011
CN    102147548 A    8/2011
(Continued)

OTHER PUBLICATIONS

1st Office Action of counterpart Chinese Patent Application No. 201810779922.5 dated Apr. 21, 2020.
(Continued)

*Primary Examiner* — Seahvosh Nikmanesh

(57) ABSTRACT

The present application relates to an array substrate, a display panel and a method of manufacturing the same, the array substrate comprising a substrate, a plurality of active switches, a color filter layer, a spacer unit layer, and an electrode layer formed on the color filter layer and the spacer unit layer.

10 Claims, 4 Drawing Sheets

(52) U.S. Cl.
CPC ...... *H01L 27/1262* (2013.01); *G02F 1/13398* (2021.01); *G02F 1/136222* (2021.01)

(56) References Cited

U.S. PATENT DOCUMENTS

| | | | |
|---|---|---|---|
| 2015/0138465 A1* | 5/2015 | Huang | G02F 1/1368 349/38 |
| 2017/0059952 A1 | 3/2017 | Itou et al. | |
| 2017/0139297 A1* | 5/2017 | Cao | G02F 1/134363 |

FOREIGN PATENT DOCUMENTS

| | | |
|---|---|---|
| CN | 102736329 A | 10/2012 |
| CN | 102879955 A | 1/2013 |
| CN | 103163696 A | 6/2013 |
| CN | 103681765 A | 3/2014 |
| CN | 103715231 A | 4/2014 |
| CN | 103809339 A | 5/2014 |
| CN | 106773405 A | 5/2017 |
| JP | H1068955 A | 3/1998 |

OTHER PUBLICATIONS

2nd Office Action of counterpart Chinese Patent Application No. 201810779922.5 dated Sep. 7, 2020.

* cited by examiner

ARRAY SUBSTRATE, DISPLAY PANEL AND METHOD OF MANUFACTURING THE SAME

CROSS REFERENCE TO RELATED APPLICATIONS

The present application is a Continuation Application of PCT Application No. PCT/CN2018/124221 filed on Dec. 27, 2018, which claims the benefit of Chinese Patent Application No. 201810779922.5, filed on Jul. 16, 2018, which is incorporated herein by reference in its entirety.

FIELD OF THE DISCLOSURE

The present application relates to the field of display technologies, in particular, to an array substrate, a display panel, and a method of fabricating the same.

BACKGROUND OF THE DISCLOSURE

The liquid crystal display panel generally includes an upper substrate, a lower substrate, and a liquid crystal layer disposed between the two substrates. The working principle is to control the rotation of the liquid crystal molecules of the liquid crystal layer by applying a driving voltage on the two substrates.

The liquid crystal display panel is prone to unevenness in color and poor display performance due to misalignment of the upper and lower plates, in the industry, often Color Filter on Array (COA) and spacer technology on the array (POA, PS on Array) are used to improve these undesirable phenomena; the processes in the COA and POA process are concentrated on the lower substrate to further simplify the structure of the upper substrate and reduce the probability of occurrence of undesirable phenomena.

The array process in the conventional COA+POA technology is based on the order of thin film transistor (TFT) process, a color filter process, and an electrode layer (PE, Pixel Electrode process, spacer unit layer (PS, Photo Spacer) process, wherein the PS process will be scheduled after the PE process is completed. Since the PS process is performed after the PE process and the spacer unit is formed on the electrode layer, the signal line (not shown) of the lower substrate corresponding to the structure has a larger loading, thereby increasing the material and cost of the liquid crystal display panel.

SUMMARY OF THE DISCLOSURE

The purpose of the present application is to provide an array substrate, a display panel, and a method of manufacturing the same, which reduce the loading on the substrate signal line.

The present application provides an array substrate comprising:
a substrate including a display region and a non-display region;
a plurality of active switches arrayed on the substrate;
a color filter layer arrayed on the substrate and formed on the plurality of active switches;
a spacer unit layer formed on the color filter layer;
an electrode layer formed on the color filter layer and the spacer unit layer, the electrode layer including a first electrode layer located in the display region and a second electrode layer located in the non-display region.

In an embodiment, the spacer unit layer includes a plurality of spacer units, and the first electrode layer includes a first electrode region overlying the spacer unit.

In an embodiment, wherein the first electrode overlying the spacer unit includes: the first electrode region overlies a side surface and/or an upper end surface of the spacer unit.

In an embodiment, wherein the first electrode region is formed on at least a portion of the spacer unit.

In an embodiment, the first electrode layer further includes a second electrode region formed on the color resist unit, the second electrode region connecting with the first electrode region.

In an embodiment, the second electrode layer is insulated from the first electrode layer.

The present application further provides a display panel comprising:
a first substrate including a common electrode layer;
a second substrate including above array substrate, the second substrate being disposed opposite to the first substrate;
the second electrode layer is communicated with the common electrode layer.

The present application further provides a method for manufacturing array substrate comprising steps of:
providing a substrate, forming a plurality of active switches on the substrate;
forming a color filter layer on the substrate;
forming a spacer unit layer on the color filter layer;
forming an electrode layer on the color filter layer and the spacer unit layer, including forming a first electrode layer in a display region of the substrate, and forming a second electrode layer in a non-display region of the substrate.

In an embodiment, a plurality of color resist unit is formed on the substrate to constitute the color filter layer, and a spacer unit is formed on at least a portion of the color resist unit, the plurality of spacer units constituting the spacer unit layer.

In an embodiment, the first electrode layer includes a first electrode region formed on the spacer unit, and the first electrode region is formed on a side surface and/or an upper end surface of the spacer unit.

In order to solve the above technical problems, the present application provides an array substrate, a display panel, and a method of fabricating the same. By forming the electrode layer on the spacer unit layer, the distance between the signal line and the electrode layer is increased, so that the capacitance is reduced, and the loading of the signal line of the lower substrate is reduced. At the same time, the gold ball material and the coating process may be omitted, thereby reducing the material and cost of the array substrate.

DETAILED DESCRIPTION OF THE EMBODIMENTS

Figure 1:
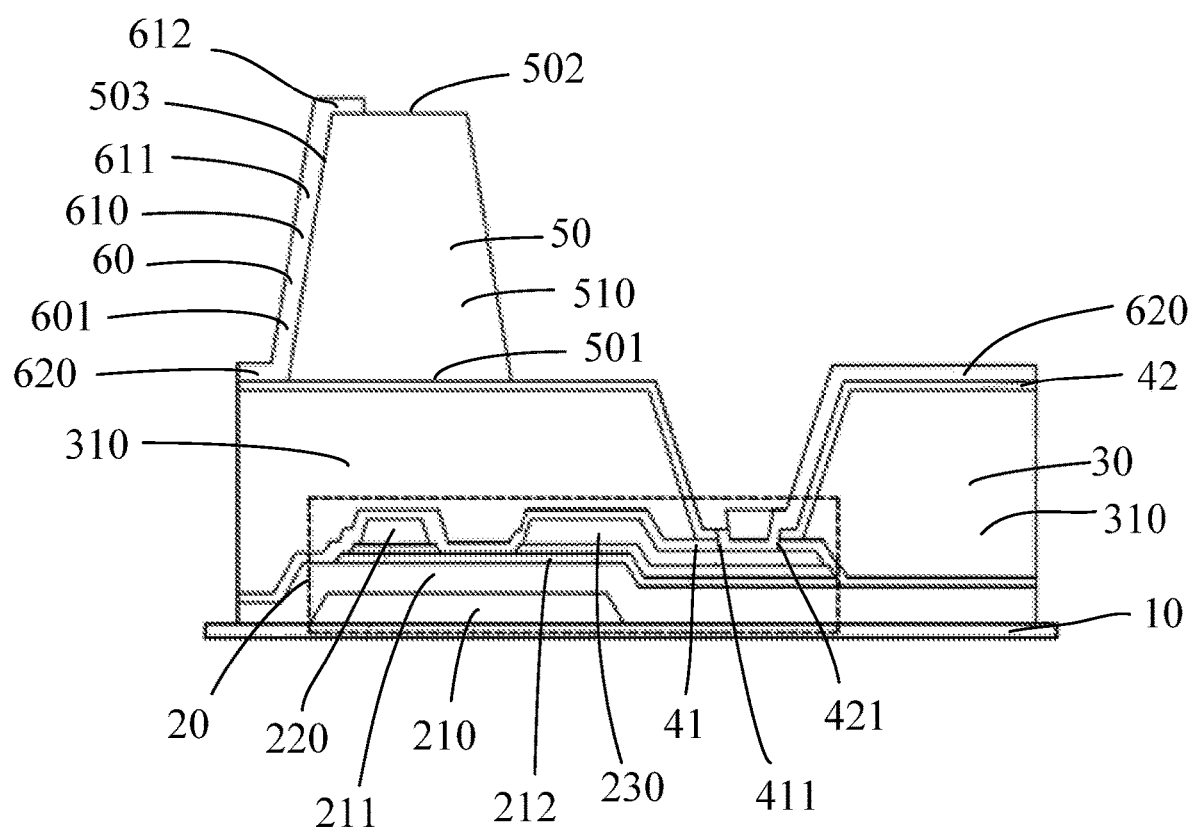
FIG. 1 is a cross-sectional structural view of a display area of an array substrate according to an embodiment of the present application.

The embodiments of the present application are described in detail below, and the examples of the implementations are illustrated in the drawings, wherein the same or similar reference numerals are used to refer to the same or similar elements or elements having the same or similar functions. The embodiments described below in conjunction with the drawings are illustrative, which are intended to illustrate the present application, but not to limit the present application.

Directional terms mentioned in the present application, such as "upper", "lower", "front", "back", "left", "right", "inside", "outside", "side", etc., are only referring to the orientation of the additional drawings. Therefore, the directional terms used are for the purpose of illustration and understanding of the present application.

The size and thickness of each assembly shown in the drawings are arbitrarily shown for the sake of understanding and convenience of description, but the present application is not limited thereto.

In the figures, the thickness of layers, films, panels, regions, etc. are exaggerated for clarity. In the drawings, the thickness of layers and regions are exaggerated for the purposes of illustration and description. It will be understood that when an assembly such as a layer, a film, a region or a substrate is referred to as being "on" another assembly, the assembly can be directly on the other assembly or an intermediate assembly can also be present. In addition, in the specification, the word "comprising", unless explicitly stated as the opposite, is to be understood to include the assembly, but does not exclude any other assemblies. Further, in the specification, "on" means being located above or below the target assembly, and does not mean that it must be located on top of the top based on gravity.

To further illustrate the technical means adopted by the present application to realize the expected purposes and effects thereof, the specific embodiments, structures, features, and effects of an array substrate, a display panel, and a manufacturing method according to the present application are described in detail below.

Figure 2:
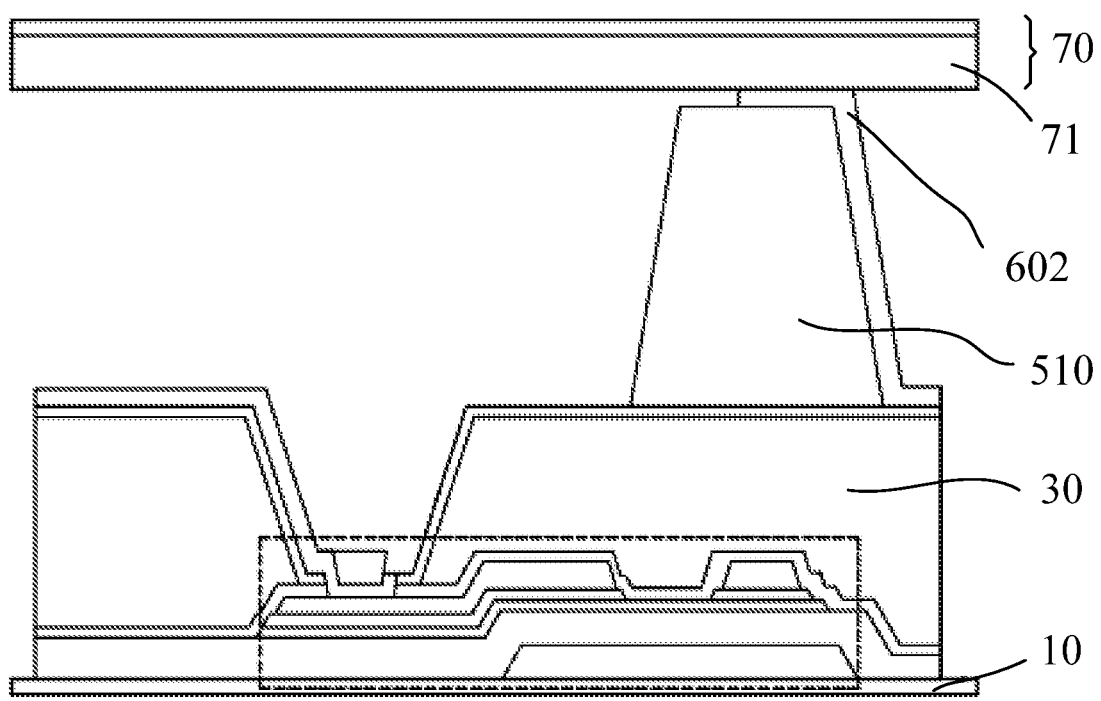
FIG. 2 is a cross-sectional structural view of a non-display area of an display panel according to an embodiment of the present application.

As shown in FIGS. 1 and 2, an embodiment of the present application provides an array substrate comprising a substrate 10, an active switch 20 formed on the substrate 10, a color filter layer 30 formed on the active switch 20, a spacer unit layer 50 formed on the color filter layer 30, and an electrode layer 60 formed on the color filter layer 30 and the spacer unit layer 50. The array substrate provided in the present embodiment may be further configured to be a process display panel, such as a liquid crystal display panel.

The positional relationship between each assembly and assemblies in the array substrate provided by the embodiment of the present application is specifically described below.

In an embodiment, the substrate 10 is made of a glass material and includes a display area and a non-display area.

In the present embodiment, the active switch 20 is a thin film transistor (TFT) layer that is mainly configured to control the standing angle of the liquid crystal. Specifically, the thin film transistor layer is formed by depositing a layer of film on the substrate 10 as a channel region including a gate 210, a source 220 and a drain 230. A gate insulating layer 211 is disposed on the gate 210, and a source 220 and a drain 230 are disposed on the gate insulating layer 211.

A thin film transistor is an insulated gate field effect transistor, and its working principle is as follows: when the gate 210 is applied with a positive voltage, the gate positive voltage generates an electric field in the gate insulating layer 211, and a power line is directed from the gate 210 to the surface of the semiconductor active layer 212 while generating an induced charge at the surface. As the gate voltage increases, an inversion layer is formed in the semiconductor active layer 212. When a strong inversion is reached (i.e., when the turn-on voltage is reached), carriers are passed through the channel upon applying a voltage between the source 220 and the drain 230. When the voltage between the source 220 and the drain 230 (hereinafter referred to as the source-drain voltage) is small, the conductive channel is approximately a constant resistance, and the leakage current linearly increases as the source-drain voltage increases. When the source-drain voltage is large, it affects the gate voltage, so that the electric field in the gate insulating layer 211 gradually weakens from the source end to the drain end, the electrons in the surface inversion layer of the thin film transistor layer gradually decrease from the source end to the drain end, and the channel resistance increases as the source-drain voltage increases. The increase in leakage current becomes slow, and the corresponding linear region transitions to the saturation region. When the source-drain voltage is increased to a certain extent, and the thickness of the inversion layer of the drain end is reduced to zero; the voltage is increased, and the device enters the saturation region. In the actual production of liquid crystal display panel, the thin film transistor layer mostly uses hydrogenated amorphous silicon (a-Si:H) as a main material, which mainly uses the on state of the a-Si:H TFT (greater than the turn-on voltage) to quickly charge the electrode layer 60, and uses the off state to maintain the voltage of the electrode layer 60, thereby achieving uniformity of fast response and good storage.

In an embodiment, the thin film transistor layer uses indium tin oxide (ITO) for the electrode and internal wiring.

In an embodiment, the substrate 10 further includes a first passivation layer 41 disposed on the thin film transistor layer, and the first passivation layer 41 is disposed above the source 220 and the drain 230 and completely overlies the source 220 and the drain 230. The first passivation layer 41 is provided with a via hole 411, and the drain electrode 230 is connected with the electrode layer 60 through the via hole 411.

The color filter layer 30 is formed on the first passivation layer 41. The color filter layer 30 functions mainly to form white light into colored light. In an embodiment, the color filter layer 30 includes a plurality of color resist units 310, and the plurality of color resist units 310 are distributed in an array on the substrate 10. The color filter layer 30 may have, for example, first, second, and third color resist units. In an embodiment, the first, second, and third color resist units may be, for example, red, green, and blue color resist units. In an embodiment, a color resist unit 310 of one color is corresponding to each pixel region.

In an embodiment, the substrate 10 further includes a shading layer (such as a black matrix black matrix, BM) on the color filter layer 30.

In an embodiment, the color filter layer 30 is further provided with a second passivation layer 42, and the second passivation layer 42 completely overlies the color filter layer 30. The second passivation layer 42 is provided with a through hole 421 at a position corresponding to the via hole 411, which is configured such that the electrode layer 60 extends into the via hole 411 to be connected with the drain 230.

In an embodiment, the substrate 10 further includes a shading layer (such as a black matrix black matrix, BM) on the color filter layer 30. The shading layer is further provided with the second passivation layer 42, and the second passivation layer 42 completely overlies the shading layer. The second passivation layer 42 is provided with a through hole 421 at a position corresponding to the via hole 411, which is configured such that the electrode layer 60 extends into the via hole 411 to be connected with the drain 230.

The spacer unit layer 50 includes a plurality of spacer units 510, and the spacer units 510 are made of an insulating material. In an embodiment, the spacer unit 510 is disposed on the substrate 10, and a plurality of stages (not labeled) corresponding to the spacer unit 510 are disposed on the substrate 10, so that the spacer unit 510 may maintain the panel spacing more stably. Specifically, the spacer unit 510 is disposed on at least a portion of the color resist unit 310. In an embodiment, the spacer unit 510 is formed only on a portion of the color resist unit 310, instead of the spacer unit 510 being formed on each of the color resist units 310. The spacer unit 510 includes a lower end surface 501 facing the color filter layer 30 and an upper surface facing the array substrate 100. The upper surface of the spacer unit 510 includes an upper end surface 502 opposite to the lower end surface 501 and a side surface 503 connecting the upper end surface 502 with the lower end surface 501. In an embodiment, the spacer unit 510 has a trapezoidal column shape, and an area of the upper end surface 502 thereof is smaller than an area of the lower end surface 501.

In the present embodiment, the electrode layer 60 includes a first electrode layer 601 and a second electrode layer 602, the first electrode layer 601 being located in the display area and the second electrode layer 602 being located in the non-display area. The first electrode layer 601 is insulated from the second electrode layer 602, that is, the first electrode layer 601 and the second electrode layer 602 are not electrically connected with each other. The first electrode layer 601 is a pixel electrode layer, and the material of the pixel electrode layer is a metal or a metal oxide such as indium tin oxide (ITO). The second electrode layer 602 is a conductive electrode layer, and the material of the conductive electrode layer is also a metal or a metal oxide, preferably indium tin oxide (ITO).

The first electrode layer 601 is formed on the color filter layer 30 and the spacer unit layer 50, and is patterned. Specifically, the first electrode layer 601 includes a plurality of first electrode regions 610 and a second electrode region 620, and the first electrode region 610 overlies at least a portion of the spacer units 510, including: the first electrode region 610 overlies the side surface and/or the upper end surface of the spacer unit 510, and the second electrode region 620 overlies the color resist unit 310.

A portion of the first electrode region 610 overlying the side surface 503 of the spacer unit 510 is defined as a first portion 611, and a portion of the first electrode region 610 overlying the upper end surface 502 of the spacer unit 510 is defined as a second portion 612. Since the electrode layer 60 is patterned, for the finally formed array substrate, on a portion of color resist unit 310, only the second electrode region 620 is formed; on a portion of color resist unit 310, the first electrode region 610 and the second electrode region 620 are simultaneously formed, and the first electrode region 610 is connected with the second electrode region 620. The first electrode region 610 overlies the side surface and/or the upper end surface of the spacer unit 510. Specifically, on a portion of the spacer unit 510, the first electrode region overlies only the side surface 503 of the spacer unit 510, that is, the first electrode region 610 includes only the first portion 611, and the first portion 611 is connected with the second electrode region 620; on a portion of the spacer unit 510, the first electrode region 610 overlies the side surface 503 and the upper end surface 502 of the spacer unit 510 simultaneously, and the first electrode region 610 includes the first portion 611 and the second portion 612, the first portion 611 connecting the second electrode region 620 and the second portion 612.

The second electrode layer 602 is formed on the color filter layer 30 and the spacer unit layer 50 in the non-display region, and is patterned.

In an embodiment, the upper surface of the stage (not shown) corresponding to the spacer unit 510 disposed on the substrate 10 is the upper surface of the second passivation layer 42, and the spacer unit 510 is formed on the upper surface of the second passivation layer 42 while the second electrode region 620 being formed on the upper surface of the second passivation layer 42.

The array substrate provided by the present application increases the distance between the signal line and the electrode layer 60 by forming the electrode layer 60 on the spacer unit layer 50, thereby reducing the capacitance and hence reducing the loading of the signal line (not shown) of the substrate 10. Since the loading on the signal line is reduced, the requirements for the material of the signal line are reduced, so that the material and cost of the liquid crystal display panel may be reduced.

As shown in FIG. 2, another embodiment of the present application provides a liquid crystal display panel comprising an upper substrate 70, a lower substrate (not labeled), and a liquid crystal layer (not shown), wherein the lower substrate is made of the array substrate provided in the above embodiments, the upper substrate 70 is disposed opposite to the lower substrate, and the spacer unit 501 is disposed to stably maintain the spacing between the upper substrate 70 and the lower substrate and to define a liquid crystal spacing space. The liquid crystal spacing space is filled with a liquid crystal layer, and a plastic frame (not shown) is disposed around the lower substrate. The spacer unit 501 is disposed in the vicinity of the plastic frame, the second electrode layer 602 overlies on the spacer unit 501, and the second electrode layer 602 is communicated with the common electrode layer 71 of the upper substrate 70. Thus, the gold ball material and the coating process are omitted, so that the material and cost of the liquid crystal display panel may be further reduced. The liquid crystal display panel provided in the present embodiment may be further used as a flat or curved display panel.

Figure 3:
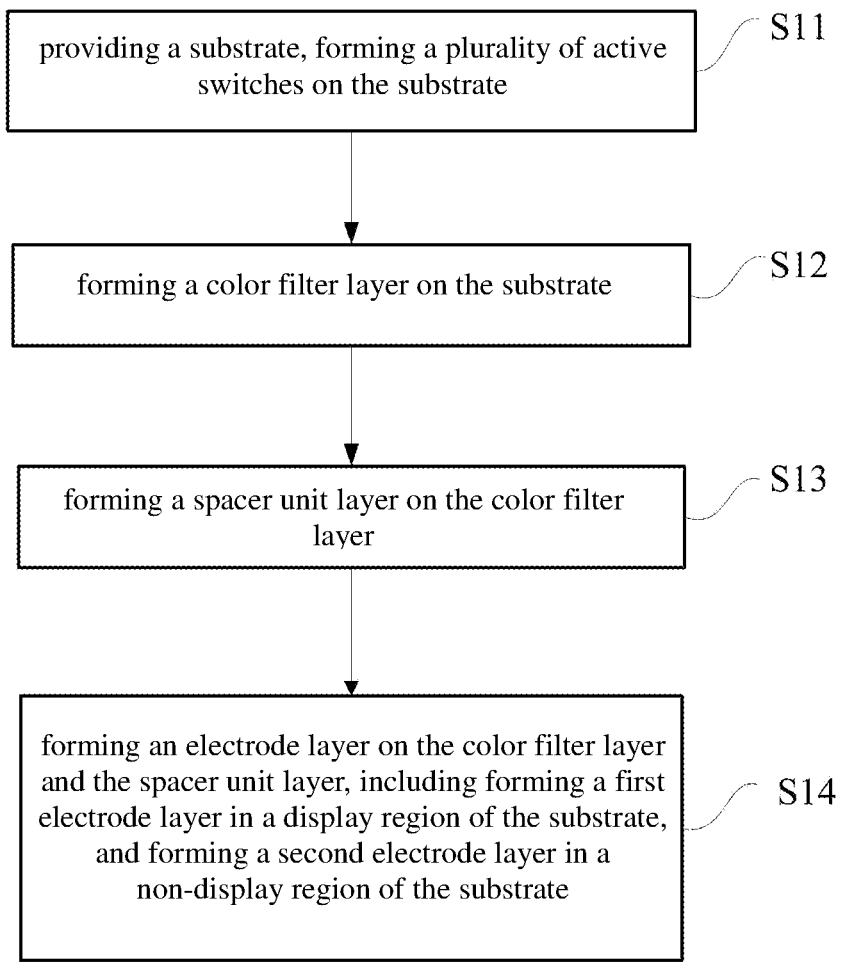
FIG. 3 is a flow chart of a method for manufacturing an array substrate according to an embodiment of the present application.
Figure 4:
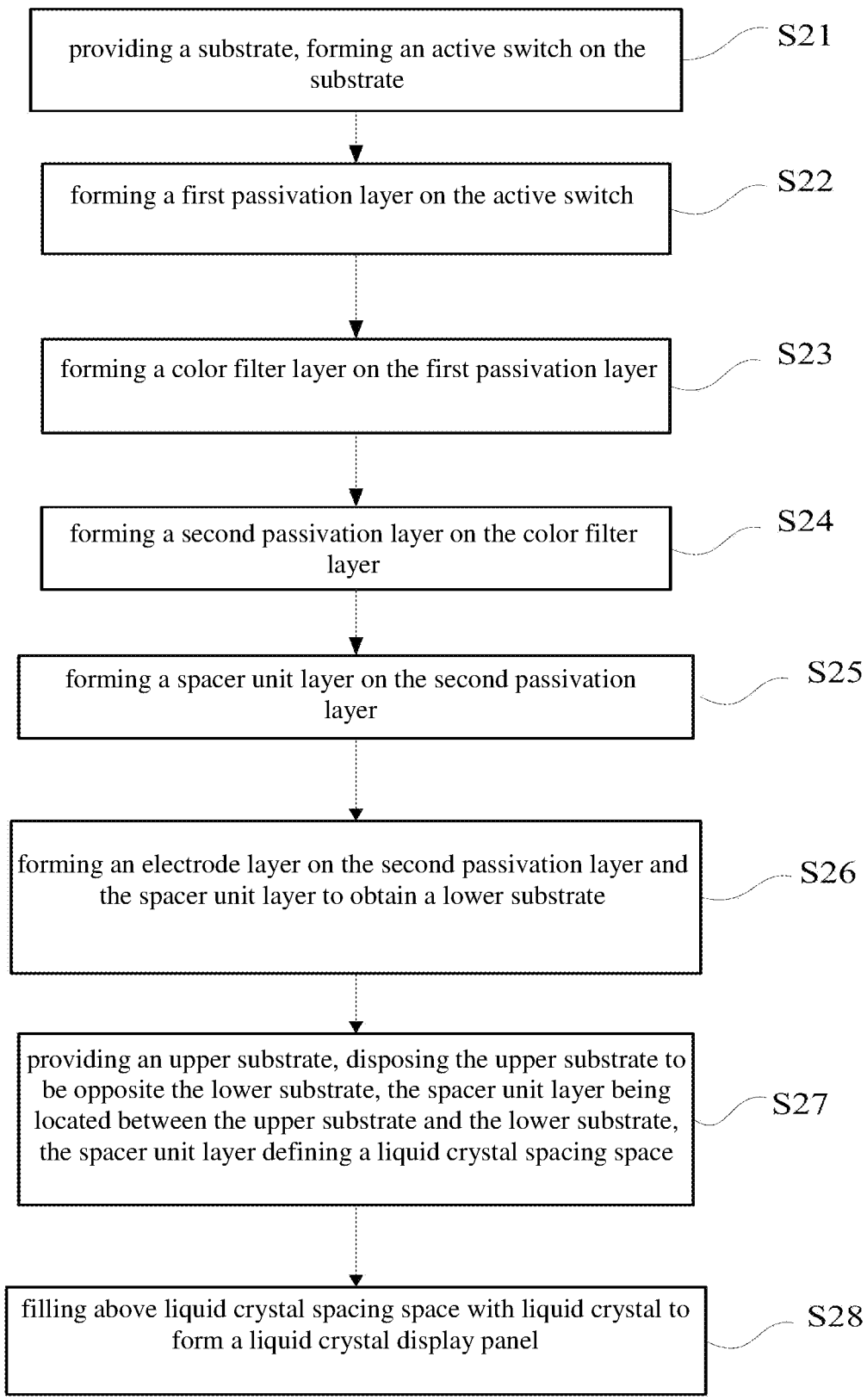
FIG. 4 is a flow chart of a method for manufacturing a liquid crystal display panel according to another embodiment of the present application.

Referring to FIGS. 1 to 3, an embodiment of the present application further provides a method for manufacturing array substrate comprising steps of:

S11: providing a substrate 10, forming a plurality of active switches 20 on the substrate 10;

in the present embodiment, the active switch 20 is a thin film transistor (TFT) layer that is mainly configured to control the standing angle of the liquid crystal. Specifically, the thin film transistor layer is formed by depositing a layer of film on the substrate 10 as a channel region including a gate 210, a source 220 and a drain 230. A gate insulating layer 211 is disposed on the gate 210, and a source 220 and a drain 230 are disposed on the gate insulating layer 211.

S12: forming a color filter layer 30 on the substrate 10;

in an embodiment, a plurality of color resist units 310 are formed on the substrate 10 in the form of an array, and the plurality of color resist units 310 constitute the color filter layer 30. The color filter layer 30 may include, for example, first, second, third, and fourth color photoresist layers. In an embodiment, the first, second, third and fourth color photoresist layers may be, for example, red, green, blue and white photoresist layers, and the material of one of the first, second, third, and fourth color photoresist layers is the same as the spacer unit. In an embodiment, a color resist unit 310 of one color is corresponding to each pixel region.

In an embodiment, the substrate 10 further includes a shading layer (such as a black matrix black matrix, BM) on the color filter layer 30.

In an embodiment, the first passivation layer 41 is formed on the substrate 10, and the color filter layer 30 is formed on the first passivation layer 41.

In an embodiment, the substrate 10 further includes a shading layer (such as a black matrix black matrix, BM) on the color filter layer 30.

In an embodiment, the color filter layer 30 is further provided with a second passivation layer 42, and the second passivation layer 42 completely overlies the color filter layer 30.

S13: forming a spacer unit layer 50 on the color filter layer 30;

the spacer unit layer 50 includes a plurality of spacer units 510, and the spacer units 510 are made of an insulating material. In an embodiment, a plurality of stages (not shown) corresponding to the spacer unit 510 are disposed on the substrate 10, so that the spacer unit 510 may maintain the panel spacing more stably. Specifically, the spacer unit 510 is disposed on the color resist unit 310. In an embodiment, the spacer unit 510 is formed only on a portion of the color resist unit 310, instead of the spacer unit 510 being formed on each of the color resist units 310. In an embodiment, the spacer unit 510 has a trapezoidal column shape, and an area of the upper end surface 502 thereof is smaller than an area of the lower end surface 501.

S14: forming an electrode layer 60 on the color filter layer 30 and the spacer unit layer 50, including forming a first electrode layer 601 in a display region of the substrate 10, and forming a second electrode layer 602 in a non-display region of the substrate 10.

The first electrode layer 601 is a pixel electrode layer, and the material of the pixel electrode layer is a metal or a metal oxide, preferably indium tin oxide (ITO). The second electrode layer 602 is a conductive electrode layer, and the material of the conductive electrode layer is also a metal or a metal oxide, preferably indium tin oxide (ITO). The first electrode layer 601 and the second electrode layer 602 may be patterned by a photoresist exposure development process and an etching process. Specifically, the first electrode layer 601 and the second electrode layer 602 may form a predetermined pattern through the same photomask, or may be patterned by different photomasks. In an embodiment, the first electrode layer 601 is insulated from the second electrode layer 602. The first electrode layer 601 is formed on the color filter layer 30 and the spacer unit layer 50. Specifically, the first electrode layer 601 includes a plurality of first electrode regions 610 and a second electrode region 620, and the first electrode region 610 overlies the spacer units 510, including: the first electrode region 610 overlies the side surface and/or the upper end surface of the spacer unit 510, and the second electrode region 620 is formed on the color resist unit 310.

A portion of the first electrode region 610 overlying the side surface 503 of the spacer unit 510 is defined as a first portion 611, and a portion of the first electrode region 610 overlying the upper end surface 502 of the spacer unit 510 is defined as a second portion 612. Since the first electrode layer 601 and the second electrode layer 602 are formed by patterning, for the finally formed array substrate, on a portion of color resist unit 310, only the second electrode region 620 is formed; on a portion of color resist unit 310, the first electrode region 610 and the second electrode region 620 are simultaneously formed, and the first electrode region 610 is connected with the second electrode region 620. The first electrode region 610 is formed on the side surface and/or the upper end surface of the spacer unit 510. Specifically, on a portion of the spacer unit 510, the first electrode region is only formed on the side surface 503 of the spacer unit 510, that is, the first electrode region 610 includes only the first portion 611, and the first portion 611 is connected with the second electrode region 620; on a portion of the spacer unit 510, the first electrode region 610 is formed on the side surface 503 and the upper end surface 502 of the spacer unit 510 simultaneously, and the first electrode region 610 includes the first portion 611 and the second portion 612, the first portion 611 connecting the second electrode region 620 and the second portion 612.

The second electrode layer 602 is formed on the color filter layer 30 and the spacer unit layer 50 in the non-display region, and is obtained by patterning.

In an embodiment, the upper surface of the stage (not shown) corresponding to the spacer unit 510 disposed on the substrate 10 is the upper surface of the second passivation layer 42, and the spacer unit 510 is formed on the upper surface of the second passivation layer 42 while the second electrode region 620 being formed on the upper surface of the second passivation layer 42.

Referring to FIGS. 1, 2 to 4, another embodiment of the present application further provides a method for manufacturing liquid crystal display panel comprising steps of:

S21: providing a substrate 10, forming an active switch 20 on the substrate 10;

the substrate 10 includes a display region and a non-display region. In the present embodiment, the active switch 20 is a thin film transistor layer that has a function of controlling the standing angle of the liquid crystal. Specifically, the thin film transistor layer is formed by depositing a layer of film on the substrate 10 as a channel region including a gate 210, a source 220 and a drain 230. A gate insulating layer 211 is disposed on the gate 210, and a source 220 and a drain 230 are disposed on the gate insulating layer 211.

The thin film transistor layer uses hydrogenated amorphous silicon (a-Si:H) as a main material, which mainly uses the on state of the a-Si:H TFT (greater than the turn-on voltage) to quickly charge the electrode layer 60, and uses the off state to maintain the voltage of the electrode layer 60, thereby achieving uniformity of fast response and good storage.

In an embodiment, the thin film transistor layer uses indium tin oxide (ITO) for the electrode and internal wiring.

S22: forming a first passivation layer 41 on the active switch 20;

specifically, the first passivation layer 41 is formed over the source 220 and the drain 230 and completely overlies the source 220 and the drain 230. A via hole 411 is formed on the first passivation layer 41.

S23: forming a color filter layer 30 on the first passivation layer 41;

the plurality of color resist units 310 are arranged in an array. The color filter layer 30 may have, for example, first, second, and third color resist units. In an embodiment, the first, second, and third color resist units may be, for example, red, green, and blue color resist units. In an embodiment, a color resist unit 310 of one color is corresponding to each pixel region.

In an embodiment, the substrate 10 further includes a shading layer (such as a black matrix black matrix, BM), which is formed on the color filter layer 30.

S24: forming a second passivation layer 42 on the color filter layer 30;

specifically, the second passivation layer 42 completely overlies the color filter layer 30.

S25: forming a spacer unit layer 50 on the second passivation layer 42;

the spacer unit layer 50 includes a plurality of spacer units 510, and the spacer units 510 are used to define a liquid crystal spacing space and are made of an insulating material. In an embodiment, a plurality of stages (not shown) corresponding to the spacer unit 510 are disposed on the substrate 10, so that the spacer unit 510 may maintain the panel spacing more stably. Specifically, the spacer unit 510 is disposed on the color resist unit 310, and the spacer unit 510 is formed only on a portion of the color resist unit 310, instead of the spacer unit 510 being formed on each of the color resist units 310. In an embodiment, the spacer unit 510 has a trapezoidal shape, and an area of the upper surface thereof is smaller than an area of the lower surface.

S26: forming an electrode layer 60 on the second passivation layer 42 and the spacer unit layer 50 to obtain a lower substrate;

forming an electrode layer 60 on the second passivation layer 42 and the spacer unit layer 50 includes forming a first electrode layer 601 on the second passivation layer 42 and the spacer unit layer 50 of the display region, and forming a second electrode layer 602 on the second passivation layer 42 and the spacer unit layer 50 of the non-display region. In an embodiment, the first electrode layer 601 is insulated from the second electrode layer 602. Both the first electrode layer 601 and the second electrode layer 60 are formed by patterning. Specifically, the first electrode layer 601 includes a plurality of first electrode regions 610 and a second electrode region 620, and the first electrode region 610 is formed on the spacer units 510, including: the first electrode region 610 is formed on the side surface and/or the upper end surface of the spacer unit 510, and the second electrode region 620 is formed on the color resist unit 310.

A portion of the first electrode region 610 formed on the side surface 503 of the spacer unit 510 is defined as a first portion 611, and a portion of the first electrode region 610 formed on the upper end surface 502 of the spacer unit 510 is defined as a second portion 612. Since the first electrode layer 601 and the second electrode layer 602 are formed by patterning, for the finally formed array substrate, on a portion of color resist unit 310, only the second electrode region 620 is formed; on a portion of color resist unit 310, the first electrode region 610 and the second electrode region 620 are simultaneously formed, and the first electrode region 610 is connected with the second electrode region 620. The first electrode region 610 is formed on the side surface and/or the upper end surface of the spacer unit 510. Specifically, on a portion of the spacer unit 510, the first electrode region is only formed on the side surface 503 of the spacer unit 510, that is, the first electrode region 610 includes only the first portion 611, and the first portion 611 is connected with the second electrode region 620; on a portion of the spacer unit 510, the first electrode region 610 is formed on the side surface 503 and the upper end surface 502 of the spacer unit 510 simultaneously, and the first electrode region 610 includes the first portion 611 and the second portion 612, the first portion 611 connecting the second electrode region 620 and the second portion 612. The upper surface of the stage (not shown) corresponding to the spacer unit 510 disposed on the substrate 10 is the upper surface of the second passivation layer 42, and the spacer unit 510 is formed on the upper surface of the second passivation layer 42 while the second electrode region 620 being formed on the upper surface of the second passivation layer 42.

The second electrode layer 602 is formed on the second passivation layer 42 and the spacer unit layer 50 in the non-display region.

S27: providing an upper substrate 70, disposing the upper substrate 70 to be opposite the lower substrate, the spacer unit layer 50 being located between the upper substrate 70 and the lower substrate, the spacer unit layer 50 defining a liquid crystal spacing space;

the spacer unit layer 50 is stably formed between the upper substrate 70 and the lower substrate to maintain the spacing between the upper substrate 70 and the lower substrate constant.

In an embodiment, the upper substrate 70 includes a common electrode layer 71, and the active switch 20 supplies power to the electrode layer 60; in the display region of the liquid crystal display panel, an electric field is formed between the common electrode layer 71 of the upper substrate 70 and the electrode layer 60 of the lower substrate. In the non-display region of the liquid crystal display panel, a plastic frame (not shown) is disposed on the lower substrate. The spacer unit 510 is disposed in the vicinity of the plastic frame, the second electrode layer 71 overlies on the spacer unit 510, and the second electrode layer 602 is communicated with the common electrode layer 71 of the upper substrate 70. Thus, the gold ball material and the coating process are omitted, so that the material and cost of the liquid crystal display panel may be further reduced.

S28: filling above liquid crystal spacing space with liquid crystal to form a liquid crystal display panel.

Through the array substrate or a liquid crystal display panel made by the manufacturing method provided by the present application, forming the electrode layer 60 on the spacer unit layer 50 increases the distance between the signal line and the electrode layer 60, reduces the capacitance and decreases the resistance of the electrode layer 60, thereby reducing the loading of the signal line (not shown) of the substrate 10. Since the loading on the signal line is reduced, the requirements for the material of the signal line are reduced while omitting the gold ball material and coating process, so that the material and cost of the array substrate or liquid crystal display panel may be further reduced.

The above description is only the preferred embodiment of the present application, and is not intended to limit the scope of the application. Any person skilled in the art can use the method disclosed above without departing from the scope of the technical solution of the present application. Many possible variations and modifications of the technical solutions of the present application are intended to be within the scope of the appended claims.

What is claimed is:
1. An array substrate, comprising:
a substrate including a display region and a non-display region;
a plurality of active switches arrayed on the substrate;
a color filter layer arrayed on the substrate and formed on the plurality of active switches;
a spacer unit layer formed on the color filter layer; and,
an electrode layer formed on the color filter layer and the spacer unit layer, the electrode layer including a first electrode layer located in the display region and a second electrode layer located in the non-display region;

wherein the first electrode layer is a pixel electrode layer, the spacer unit layer includes a spacer unit, and the first electrode layer includes a first electrode region overlying the spacer unit, wherein a vertical projection of the spacer unit along a thickness direction of the substrate has an overlap portion with a vertical projection of the first electrode layer along the thickness direction of the substrate.

2. The array substrate according to claim 1, wherein the spacer unit includes a lower end surface facing the color filter layer and an upper surface facing away from the color filter layer, the upper surface includes an upper end surface opposite to the lower end surface and a side surface connecting the upper end surface with the lower end surface, and the first electrode overlying the spacer unit includes: the first electrode region includes a first portion, and the first portion overlies the side surface of the spacer unit.

3. The array substrate according to claim 2, wherein the first electrode region is formed on at least a portion of the spacer unit.

4. The array substrate according to claim 2, wherein a plurality of color resist unit is formed on the substrate to arranged to constitute the color filter layer, and the first electrode layer further includes a second electrode region formed on the color resist unit, the second electrode region connecting with the first portion of the first electrode region.

5. The array substrate according to claim 4, wherein the second electrode layer is insulated from the first electrode layer, the first electrode region further includes a second portion, the second portion overlies the upper end surface of the each spacer unit and connects with the second electrode region through the first portion of the first electrode region.

6. The array substrate according to claim 5, wherein the active switch is a thin film transistor layer including a gate, a source, and a drain.

7. The array substrate according to claim 6, wherein the thin film transistor layer is indium tin oxide when being wired inside the electrode.

8. The array substrate according to claim 6, wherein the substrate further includes a first passivation layer disposed on the thin film transistor layer, and the first passivation layer is disposed above the source and drain and completely ovelies the source and drain; a via hole is disposed on the first passivation layer, and the drain is connected with the electrode layer through the via hole.

9. The array substrate according to claim 6, wherein the substrate further includes a shading layer, and the shading layer is located on the color filter layer.

10. A display panel, comprising:
a first substrate including a common electrode layer;
a second substrate including the array substrate as recited in claim 1.

* * * * *